United States Patent [19]

Takaki

[11] 4,370,403
[45] Jan. 25, 1983

[54] PHOTOPOLYMERIZABLE RADIATION-SENSITIVE RESIN COMPOSITION AND RADIATION-SENSITIVE SHEET MATERIAL

[75] Inventor: Kiyofumi Takaki, Yao, Japan

[73] Assignees: Tokuji Arai, Yokohama, Japan; Birger Takle, Asker, Norway

[21] Appl. No.: 261,175

[22] PCT Filed: Aug. 28, 1980

[86] PCT No.: PCT/JP80/00198

§ 371 Date: Apr. 24, 1981

§ 102(e) Date: Apr. 24, 1981

[87] PCT Pub. No.: WO81/00626

PCT Pub. Date: Mar. 5, 1981

[30] Foreign Application Priority Data

Aug. 28, 1979 [JP] Japan ............................... 54-108570

[51] Int. Cl.³ ................................................. G03C 1/78
[52] U.S. Cl. ..................................... 430/271; 430/281; 430/910; 430/919; 204/159.15
[58] Field of Search ............... 430/281, 910, 919, 271; 204/159.15

[56] References Cited

U.S. PATENT DOCUMENTS 4,113,593 9/1978 Barzynski et al. .................. 430/919
4,268,667 5/1981 Anderson ............................ 430/281
4,289,845 9/1981 Boutle et al. ....................... 430/281

OTHER PUBLICATIONS

Kosar, "Light Sensitive Systems", 1965, pp. 160–167.

*Primary Examiner*—Jack P. Brammer
*Attorney, Agent, or Firm*—Benasutti Associates, Ltd.

[57] ABSTRACT

A photopolymerizable radiation-sensitive resin composition comprising a styrene-maleic acid copolymeric resin as well as an ethylenically unsaturated compound and a photopolymerization initiator is disclosed. A radiation-sensitive sheet material comprising a support (10) having coated thereon a layer (11) of the photopolymerizable radiation-sensitive resin composition is also disclosed. The composition and sheet material disclosed herein can be conveniently used particularly in the preparation of various cards such as credit cards, banking or cash cards and the like.

15 Claims, 3 Drawing Figures

PHOTOPOLYMERIZABLE RADIATION-SENSITIVE RESIN COMPOSITION AND RADIATION-SENSITIVE SHEET MATERIAL

TECHNICAL FIELD

The present invention relates to a photopolymerizable radiation-sensitive resin composition and a radiation-sensitive sheet material comprising a layer of such composition. In particular, the present invention relates to a photopolymerizable radiation-sensitive resin composition and a radiation-sensitive sheet material comprising a layer of such composition, which are suitable for use in the preparation of identification cards (so-called ID cards) and the other similar cards having encapsulated therein a photographic image.

BACKGROUND ART

With the advance of information processing by means of computers, various cards having a magnetic coating are frequently used as an input medium to an input device of the computer. For example, typical cards include a credit card, a banking or cash card, a driver's licence card, a commutation or season ticket, a key card and the like. In these cards which have special usages, the requirements concerning the quality of the material and the construction imposed on them are widely varied. For instance, in accordance with the standards provided by the Japanese Banker's Association and the American Banker's Association, credit cards and banking or cash cards should have a base sheet of vinyl chloride resin. Furthermore, it is generally well-known that from the view point of crime prevention, such care must be taken that the cards may not easily be forged or falsified and may not unjustly be used by any person other than the owner. These aims which are very desirable to prevent crime and other related aims are best achieved by, for example, reproducing a photograph of the owner's face and or a signature of the owner on the surface of the base sheet of the card and furthermore covering the reproduction with a protective sheet. However, in order to realize the above aims, it is necessary to first solve several technical problems. Examples of the problems to be solved are that the reproduced photograph or signature should be clear and fine and be easily discriminable and that the protective sheet should be firmly adhered to the base sheet. Furthermore, it will be understood, if the use of the card as an input medium to an input device of a computer is considered, that the card should not be deformed and the surface of the card must not lose its smoothness. However, in fact, it is very troublesome to form an image having a beautiful color and an excellent discrimination quality on the base sheet. For example, since cards of this type have different patterns to be reproduced on the card, it is difficult and expensive to attain a precise reproduction of the patterns through a printing process. Furthermore, since the reproduction is interposed between the base sheet and the protective sheet, it is necessary to take care so that the bonding of these sheets will not be undesirably affected.

It has long been effected in the formation of a person's photograph and signature on the base sheet to reproduce photographically such a photograph and signature, and it has also been well-known that various radiation-sensitive resins can be used for this object. One of the well-known radiation-sensitive resins includes diazo compounds. The diazo compounds are generally radiation-sensitive resins which are obtained by mixing a water-soluble colloidal material such as gelatin, polyvinyl alcohol, casein, emulsified polyvinyl acetate and the like, with the diazo compounds. A process for the production of cards using the above-mentioned radiation-sensitive resins comprises coating a radiation-sensitive resin on a base sheet, and exposing it to actinic radiation through a transparent negative to water-insolubilize the radiation-sensitive resin in areas exposed to radiation, namely, the exposed areas. Then, the radiation-sensitive resin in the unexposed areas on the base sheet is removed through washing with water. Thereafter, a hardened image formed on the exposed areas is dyed. While this process can provide an image having any desired colour, it suffers from such a drawback that the dyes used in dyeing of the image tend to stain the base sheet. This well-known process for the production of the cards has further drawbacks that the radiation-sensitive resins used therein have a poor shelf stability (due to their reaction in the dark) and therefore, if they are used, they must be coated on the base sheet immediately before exposure to radiation. The drawbacks similar to those can be caused even if the diazo compounds are replaced with bicromates or iron salts.

It has been well-known that radiation-sensitive resins containing diazo compounds and couplers corresponding thereto are also useful in the preparation of the cards. The well-known process for the production of cards using the above radiation-sensitive resins comprises exposing a radiation-sensitive resin-containing coating formed on a base sheet to an actinic radiation through a transparent negative, and colour developing the exposed coating in an alkaline aqueous solution or gaseous ammonia. However, this process has drawbacks in that only a few colours are usable in dyeing the images due to a limited combination of the diazo compounds and the couplers. Furthermore, this process involves undesired problems that the unexposed areas are also slightly coloured.

As another process using diazo compounds, a radiation-sensitive resin comprising a blend of the diazo compounds and pigments is also well-known. Sheet structures having a coating of such a radiation-sensitive resin are disclosed, for example, in the U.S. Pat. No. 3,136,637 (Assignee: Minnesota Mining and Manufacturing Company). The base sheet used in this U.S. application is a metal base sheet which is suitable as a printing master plate. However, even if the base sheet is replaced with one composed of vinyl chloride resins, desirable results cannot be obtained. This is because, when a diazo-type radiation-sensitive resin is coated on the base sheet composed of vinyl chloride resins, some chemical modification can be caused on the surface portion of the base sheet. The chemical modification results in marrying the unexposed areas of the base sheet. Especially, when a pigment is contained in the radiation-sensitive resin, the pigment is adsorbed onto the base sheet prior to exposure to radiation. Therefore, even after the removal of the radiation-sensitive resin in the unexposed areas as a result of development, a stain on the base sheet due to the adsorbed pigment can not been removed and remains indelible. Apparently, this is because any organic solvent which will dissolve vinyl chloride resins, such as toluene, xylene, methyl ethyl ketone, cyclohexane, acetone, ethyl acetate and the like, must be used in the radiation-sensitive resin composition. The chemical modification in the surface of the base sheet results in, in addition to the marrying mentioned above, difficulties in adhering a protective film to the surface of the base sheet through heat fusion. These drawbacks are very undesirable in the production of the cards, but the cause or causes have not yet been clarified.

It is also known to produce a coloured image on the base sheet using a silver salt emulsion. For example, this process is a dye transfer process developed by Eastman Kodak Company. According to this imaging process, a silver salt matrix film (Trade name: KODAK Dye Transfer Film) is firstly imagewise exposed with a tungsten lamp through a transparent negative. Then, the exposed film is developed with a developing solution to harden gelatin in the exposed areas of the film, and the unexposed areas of the film are washed off with warm water. Thereafter, the exposed areas are dyed with a dye, and the dyed image is transferred to a base sheet. Thus, a coloured image can be formed on the base sheet. However, the coloured image obtained through the above imaging process has drawbacks in that, if in the subsequent processing steps a protective coating is formed on the base sheet or a protective sheet is laminated on the base sheet, the coloured image bleeds out. Further, the matrix film which was used in the transfer process must be discarded due to nonuse in the subsequent steps, and this means that the use of the matrix film is not economical. In addition to the above process, a process which comprises directly adhering a matrix film of the above-mentioned type, the unexposed areas of which can be washed off, to the base sheet is also proposed. According to this process, the exposed and developed matrix film can be blackened with a blackened silver bleaching solution containing as a main component potassium ferrocyanide and the like, and, after bleaching the film, the bleached portion of the film can be dyed to obtain a coloured image having any desired colour. Accordingly, the thus obtained film can be bonded to the base sheet by means of a special adhesive to form any desired coloured image on the base sheet. This process would be economical since the matrix film used herein also functions as the laminate film. However, the cards produced in accordance with this process are likely to undergo deformation or become crooked because the quality of the matrix film is different from that of the base sheet. Furthermore, potassium ferrocyanide used in the bleaching step is likely to cause water pollution problems, since the solution containing waste potassium ferrocyanide is decomposed by ultra violet radiations in sun light to form toxic cyanogen.

Various radiation-sensitive resins are further well-known. For example, Japanese Patent Publication Gazette No. 45-022,085 discloses the radiation-sensitive resins containing polyazide vinyl benzoate, and those containing cinnamic acid esters and the like. However, most of these radiation-sensitive resins cannot be coated on the base sheet composed of vinyl chloride resins, since an organic solvent which may dissolve the base sheet is contained either in the radiation-sensitive resins or in the developing solution which is used in the subsequent processing.

The inventors, aware of the above information, made efforts to develop a suitable photopolymerizable radiation-sensitive resin composition for forming photographic images, which has not the drawbacks mentioned above. As a result of this, we found the following photopolymerizable radiation-sensitive resin compositions.

(A) A photopolymerizable composition which is soluble in water or weak alkaline aqueous solution, the composition comprising different polymerizable polymers such as polymers of polyester type, polyacryl type, polyurethane type, polyamide type or cellulose type, those containing double bonds in its molecule, those having been modified and the like, a crosslinking agent (binding agent), and a photoreaction initiator;

(B) A photopolymerizable composition which comprises polymerizable monomers, a binding agent soluble in water or weak alkaline aqueous solution, and a photoreaction initiator, and;

(C) A photopolymerizable composition which comprises polymerizable oligomers, a binding agent soluble in water or weak alkaline aqueous solution, and a photoreaction initiator.

However, these polymerizable radiation-sensitive resin compositions can not show a practically useful sensitivity without adding thereto a suitable photopolymerization initiator, since their photopolymerization proceeds slowly. In order to attain a practically useful photopolymerization rate, different photopolymerization initiators must be added to the composition, as its essential component, separately or in combination of two or three initiators depending upon the particular radiation-sensitive resin composition to be used. However, these photopolymerizable compositions cause a dark reaction under the influence of heat and the like, are gradually polymerized, and become insoluble in a solvent. In addition, such a reaction is generally further aaccelerated through the addition of the photopolymerization initiator. Generally, for the purpose of inhibiting polymerization caused during keeping or producing under the influence of heat and the like, various polymerization inhibitors are added to the photopolymerizable compositions to improve their shelf stability. However, while the addition of suitable polymerization initiators is effective to improve the shelf stability of the photopolymerizable compositions, it also has drawbacks in that the photopolymerizability of the compositions is inhibited. Therefore, the amount of the polymerization initiators to be added is necessary to be remarkably small.

The photopolymerizable compositions which can effect only a limited photopolymerization and show a low rate of hardening are not preferable as the composition for use in the production of credit cards. This is because it is difficult to reproduce an image having excellent sharpness from compositions with a low hardening rate, since such compositions need a long exposure time to attain an imagewise exposure for imaging. In this connection, a method of shortening the exposure time, which comprises increasing the amount of radiation energy emitted from the exposure light source, is proposed. However, in practicing this method, we must allow for remarkable exothermic heat produced at the same time. For example, when a substrate such as a sheet of vinyl chloride is used, the heat from the light source will cause undesirable results such as a deformation and modification of the substrate and the like.

DISCLOSURE OF THE INVENTION

It is an object of the present invention to provide a novel photopolymerizable radiation-sensitive resin composition which can completely eliminate the above-discussed drawbacks of the prior radiation-sensitive resins.

It is another object of the present invention to provide a photopolymerizable radiation-sensitive resin composition which does not contain an organic solvent capable of dissolving, particularly, vinyl chloride or vinyl chloride-vinyl acetate copolymeric resins.

Furthermore, it is another object of this invention to provide a photopolymerizable radiation-sensitive resin composition which is soluble in water or a highly diluted alkaline aqueous solution and in which the dissolved components can be easily recovered through neutralization.

In addition, it is another object of this invention to provide a photopolymerizable radiation-sensitive resin composition in which pigments may be freely incorporated depending upon the desired hue.

In addition, it is another object of this invention to provide a photopolymerizable radiation-sensitive resin composition which is photopolymerized by ultraviolet radiation having wavelengths of from 2,500 to 4,200 Å and is not photopolymerized by radiation having wavelengths of more than 4,200 Å, and therefore which may be subjected to an exposure step under daylight conditions.

In addition, it is another object of this invention to provide a photopolymerizable radiation-sensitive resin composition having a long-term shelf stability.

A further object of the invention is to provide a radiation-sensitive sheet material having a water-soluble or weak alkali-soluble protective coating formed on a layer of radiation-sensitive material, in which the protective coating does not inhibit a photopolymerization of radiation-sensitive resin which is induced by actinic radiation irradiated onto the layer of radiation-sensitive material, and does not chemically bond with the photopolymerized resin during photopolymerization of the radiation-sensitive resin.

According to the present invention, there is provided a photopolymerizable radiation-sensitive resin composition comprising a styrene-maleic acid copolymeric resin as well as an ethylenically unsaturated compound and photopolymerization initiator.

Also, according to the present invention, there is provided a radiation-sensitive sheet material comprising a support and, at least, a layer of a radiation-sensitive material coated on one side of the support, said layer of the radiation-sensitive material being a layer of a photopolymerizable radiation-sensitive resin composition which comprises a styrene-maleic acid copolymeric resin as well as an ethylenically unsaturated compound and a photopolymerization initiator.

According to this invention, the sheet material having sensitivity can be obtained, and the surface of the obtained sheet material has an excellent abrasion resistance. When the sheet material is conventionally exposed to an actinic radiation and then washed with water or a weak alkaline aqueous solution, an overall protective coating formed on the sheet material and an unexposed radiation-sensitive material lying under the protective coating can be completely removed. Thus, only an image which is formed from the insoluble radiation-sensitive material existing within the exposed areas of the sheet material is sharply produced. While the surface of the support, which surface lies under the insoluble radiation-sensitive material, can be firmly bonded to said insoluble radiation-sensitive material, the other surface of the support is not changed and is as before. Therefore, it is possible to firmly bond a protective sheet to the support to protect the image formed on the support.

BRIEF DESCRIPTION OF THE DRAWINGS

The accompanying drawings will be briefly described. In these drawings.

BEST MODE FOR CARRYING OUT THE INVENTION

Figure 1:
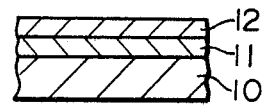
FIG. 1 is a cross-sectional view of the radiation-sensitive sheet material according to the present invention, which comprises a layer of the photopolymerizable radiation-sensitive resin composition and a protective coating.

The photopolymerizable radiation-sensitive resin compositions according to the present invention comprise polymers which are photopolymerizable and alkali-soluble. As the polymers of this type, for example, novolak type phenol-formaldehyde resins, copolymers of acrylic or methacrylic acid, alkyd resins having a high acid value, shellac-acrylic acid copolymers, styrene-maleic acid copolymeric resins and the like are well-known. Among these polymers, particular styrene-maleic acid copolymeric resins are selected and used in the present invention. The reason why the above particular polymers are used in the present invention is based on the following facts. Namely, while the styrene-maleic acid copolymeric resin is photopolymerized by actinic radiation in the presence of a photopolymerization initiator and, as a result of this, its inherent alkali-solubility is lost, the unpolymerized styrene-maleic acid copolymeric resin, when it has added thereto an unsaturated compound with a polymerizable ethylene bond, its alkali-solubility is increased greatly. Accordingly, the polymer having added thereto an unsaturated compound can be dissolved with alkali weaker than that used in dissolving the polymer, comprising only styrene-maleic acid copolymeric resin having no unsaturated compound added thereto, and the photopolymerization initiator. Although many similar experiments were repeated using other polymers, an alkali-solubility which was equivalent to or more than than of the above-mentioned styrene-maleic acid copolymeric resin could not be attained.

Styrene-maleic acid copolymeric resins which are copolymeric resins of styrene and maleic anhydride are widely used in many applications such as paints, sizing agents for textiles, aqueous printing inks and the like. These resins are commercially available, e.g., from Sinclair Petrochemicals, Inc. under the trade name: SMA Resin, from Monsanto Chemical Co. under the trade name: LYTRON Resin, and from Daido Industrial Co., Ltd. under the trade name: Stylite, respectively. The styrene-maleic acid copolymeric resins generally have a molecular weight of from 700 to 50,000. The molecular weight varies depending upon various factors such as amounts of monomers used in the production of the copolymeric resins, reaction period of time, degree of esterification and the like. Furthermore, the acid value of these copolymeric resins usually ranges from 130 to 500. The styrene-maleic acid copolymeric resins useful in embodying the present invention have a molecular weight of from 1,000 to 2,000 and an acid value of from 130 to 220. Styrene-maleic acid copolymeric resins, which are partially esterified styrene-maleic anhydride resins and contain carboxyl groups yet remaining in the molecule, are particularly preferred.

The following Table I illustrates the results which are obtained when the amount of an ethylenically unsaturated compound to be added to the styrene-maleic acid copolymeric resin is widely varied. It will be understood from this table that the alkali-solubility of the styrene-maleic acid copolymeric resin is more and more increased with the increase in the amount of the unsaturated compound added thereto. In the Table I below, all parts used herein are by weight, and alkali used herein is a 0.0005% solution of anhydrous sodium carbonate. The thickness of the dried coating is 10 microns.

TABLE I

| Styrene-maleic acid copolymeric resin | Unsaturated compound | Initiator | Speed of development | Unexposed coating | Exposed and developed coating |
|---|---|---|---|---|---|
| 94 parts | 0 | 6 parts | more than 180" | hard, non-tacky | hard, non-tacky, cracks when bent |
| 80 parts | 14 parts | 6 parts | 60"–90" | hard, non-tacky | hard, non-tacky, slightly poor solvent resistance |
| 72 parts | 22 parts | 6 parts | 35"–45" | hard, non-tacky | hard, non-tacky, good coating |
| 64 parts | 30 parts | 6 parts | 30–40" | hard, non-tacky | hard, good coating |
| 58 parts | 36 parts | 6 parts | 20"–30" | hard, non-tacky | hard, good coating |
| 52 parts | 42 parts | 6 parts | 15"–25" | slightly hard, slightly tacky | slightly brittle, cracks when bent |
| 35 parts | 59 parts | 6 parts | 10"–20" | soft, tacky | brittle, easily cracks |

The ethylenically unsaturated compounds useful in the present invention are polymerizable compounds which contain one or more ethylenically unsaturated double bonds in one molecule thereof. The term "ethylenic compounds", when used herein, is intended to mean the compounds (including monomers, prepolymers, dimers, trimers and other oligomers) which contain at least one ethylenically unsaturated double bond in their chemical structure.

The ethylenic compound which is advantageously usable in embodying the present invention is a mixture of (A) one or more ethylenic compounds (with a terminal hydroxyl group) having a molecular weight of 150 or more and a boiling point, under normal pressure, of 100° C. or more and containing at least one acryloyl or methacryloyl group, and (B) one or more ethylenic compounds having a molecular weight of 150 or more and a boiling point, under normal pressure, of 100° C. or more and containing at least one acryloyl or methacryloyl group, but containing no terminal hydroxyl group.

Examples of the above-mentioned ethylenic compounds (A) include, for example, polyester monoacrylate represented by the structural formula:

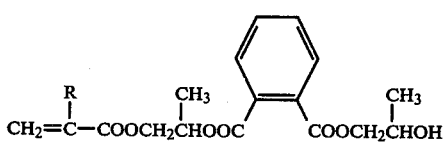

where R is H or CH$_3$, 2-hydroxyethyl methacrylate, 2-hydroxyethyl acrylate, 1,4-butylene glycol monoacrylate and the like.

Examples of the above-mentioned ethylenic compounds (B) include, for example, polyethylene glycol diacrylate, 1,3-butylene glycol diacrylate, 1,4-butylene glycol diacrylate, 1,6-hexane glycol diacrylate, neopentyl glycol diacrylate, 2,2-bis (4-acryloxy diethoxy phenyl) propane, 2,2-bis (4-acryloxy propyloxy phenyl) propane, trimethylol propane triacrylate, tetramethylol methane triacrylate, ethylene glycol dimethacrylate, polyethylene glycol dimethacrylate, 1,6-hexane glycol dimethacrylate, polypropylene glycol dimethacrylate, 2,2-bis (4-methacryloxy ethoxy phenyl) propane, 2,2-bis (4-methacryloxy diethoxy phenyl) propane, trimethylol propane trimethacrylate, polyester acrylate oligomer, polyamide acrylate, epoxy acrylate, polyurethane acrylate, polyester monoacrylate represented by the structural formula:

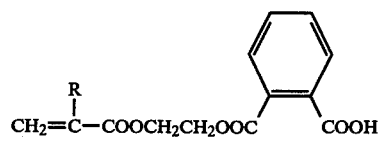

wherein R is H or CH$_3$, and the like.

Examples of the photopolymerization initiators usable in the present invention are, for example, one or more compounds selected from the group consisting of acyloin such as benzoin and the like; acyloin derivatives such as benzoin methyl ether, benzoyl ethyl or isopropyl or benzoin isobutyl ether and the like; ketones such as benzophenone, acetophenone, methyl ethyl ketone, benzyl and the like; substituted benzophenones such as Michler's ketone, halogenated benzophenone and the like; aldehydes such as benzaldehyde, dimethyl amino benzaldehyde, 4-hydroxy-3-methoxy benzaldehyde, naphthal-aldehyde, cinnamaldehyde and the like, and; substituted or unsubstituted polynuclear quinones such as xanthone, 3-chloroxanthone, 3,9-dichloroxanthone, anthraquinone, 1-chloroanthraquinone, 2-ethylanthraquinone, 1,4-naphthoquinone and the like.

In the radiation-sensitive resin compositions according to the present invention, various pigments may be optionally incorporated therein depending upon the desired hue. As typical examples of useful pigments, for example, the following compounds can be mentioned.

However, the present invention should not be restricted to these compounds:

Yellow pigments: Benzidine yellow, hansa yellow, chrome yellow and the like

Red pigments: Brilliant carmine, permanent reds, lithol rubine, watchung red and the like Blue pigments: Phthalocyanine blue, alkali blue and the like Black pigments: Carbon black, iron black and the like.

In addition to these pigments, finely divided silicic acid may be used as a filler or a viscosity modifier.

The photopolymerizable radiation-sensitive resin composition in accordance with the invention comprises a styrene-maleic acid copolymeric resin as an alkali-soluble polymer as well as 10 through 60% by weight, based on the weight of said copolymeric resin, of ethylenically unsaturated compound and 1 through 10% by weight, based on the total weight of the copolymeric resin and the ethylenically unsaturated compound, of the photopolymerization initiator. With regard to the ethylenically unsaturated compound, it is further added that a ratio, of percentage by weight, of the compound (A) having a molecular weight of 150 or more, a boiling point, under normal pressure, of 100° C. or more, at least one acryloyl or methacryloyl group, and a terminal hydroxyl group to the compound (B) having a molecular weight of 150 or more, a boiling point, under normal pressure, of 100° C. or more, and at least one acryloyl or methacryoyl group is 40 through 60%. If the above ethylenic compound (B) is used in an amount which is less than the lower limit of the above range, drawbacks such as delay of photopolymerization and the like will be caused. On the other hand, if the ethylenic compound (B) is used in an amount more than the upper limit of the above range, drawbacks such as insufficient adhesion of the photocured coating to vinyl chloride and the like will result.

In the photopolymerizable radiation-sensitive resin composition of the present invention, it is preferred that benzyl and dimethyl amino benzaldehyde are selected as the photopolymerization initiator among the above-listed photopolymerization initiators, and they are optionally combined and used so that a ratio, of percentage by weight, of dimethyl amino benzaldehyde to benzyl is within the range of from 10 to 90%. The use of a combination of the photopolymerization initiators is preferred due to the following reasons. Namely, in the composition comprising the above-discussed styrene-maleic acid copolymeric resin having incorporated therein the ethylenic compound, the resulting rate of photopolymerization is remarkably slow and therefore a practically effective sensitivity can not be obtained if each of benzyl and dimethyl amino benzaldehyde is added separately to the composition, while a very fast rate of photopolymerization can be attained if benzyl and dimethyl amino benzaldehyde are used in combination and furthermore if they are combined at a specific ratio. In addition, it was found that, although the reasons have not yet been completely grasped, the radiation-sensitive resin composition of the present invention can be kept stably for a remarkably long duration without adding any shelf stabilizer such as a thermal polymerization inhibitor and the like, if a combination of benzyl and dimethyl amino benzaldehyde is used as the photopolymerization initiator. Though similar comparison was tried using other combinations of the photopolymerization initiators, notably excellent results, which were obtained when benzyl and dimethyl amino benzaldehyde were used in combination, could not be attained.

In the photopolymerizable radiation-sensitive resin composition in accordance with the present invention, if any pigment is added to the composition, it may be added thereto in an amount of 1 through 50 parts by weight based on the weight of the composition, and if any thermal polymerization inhibitor is added to the composition, it may be added thereto in an amount of 0.01 through 2% by weight based on the weight of the composition.

The photopolymerizable radiation-sensitive resin compositions in accordance with the present invention will be further described with reference to the following examples. While the examples mentioned below illustrate the radiation-sensitive resin compositions which are suitable in the production of cards, it should be appreciated that these examples illustrate only one example of the present invention and they do not restrict the applications of the present invention and the compositions or proportions of the ingredients of the present invention. The "parts" used in the examples is intended to mean "parts by weight" unless otherwise stated.

Example 1-1

| First group: | |
|---|---|
| Styrene-maleic acid copolymeric resin | 22 parts |
| Ethylene glycol monoethyl ether | 20 parts |
| Second group: | |
| Carbon black | 3.5 parts |
| Phthalocyanine blue | 0.5 parts |
| Third group: | |
| 2-hydroxy ethyl acrylate | 7 parts |
| Trimethylol propane triacrylate | 9 parts |
| Benzyl | 1.6 parts |
| Dimethyl amino benzaldehyde | 0.4 parts |
| Ethanol | 36 parts |

Firstly, the substances of the above-mentioned first group are added to a vessel equipped with a reflux condenser, and are dissolved while stirring at a temperature of 80 to 90° C. Heating is stopped after the substances added to the vessel are completely dissolved. Thereafter the solution is allowed to cool to room temperature while stirring. The resulting solution is transferred to a porcelain or stainless steel ball mill, wherein it is milled with the substances of the above-mentioned second group for a period of about 24 hours. Thereafter, the resulting mixture is transferred to a vessel equipped with a mixer or stirrer and the like, to which the substances of the above-mentioned third group are added. Stirring is continued for a period of about 2 hours. A black-coloured radiation-sensitive resin composition can be obtained.

Example 1-2

| First group: | |
|---|---|
| Styrene-maleic acid copolymeric resin | 22 parts |
| 2-hydroxy ethyl acrylate | 9 parts |
| Second group: | |
| 2,2-bis (4-acryloxy diethoxy phenyl) propane | 7 parts |
| Benzyl | 1.6 parts |
| Dimethyl amino benzaldehyde | 0.4 parts |

-continued

| Third group: | |
|---|---|
| Carbon black | 3.5 parts |
| Phthalocyanine Blue | 0.5 parts |
| Ethylene glycol monoethyl ether | 36 parts |
| Ethanol | 20 parts |

First, the substances of the above-mentioned first group are added to a vessel equipped with a reflux condenser, and, while bubbling with air, are dissolved while stirring at a temperature of 130 to 140°. Heating is stopped after the substance added to the vessel are completely dissolved. The solution is cooled to a temperature of about 90° C. while stirring and bubbling with air are further continued. Subsequently, the substances of the above-mentioned second group are added, and are stirred for about one hour. Thereafter, the resulting solution is transferred to a porcelain or stainless steel ball mill, to which the substances of the above-mentioned third group are then added and milled for a period of about 24 hours. A black-coloured radiation-sensitive resin composition can be obtained.

Example 1-3

| First group: | |
|---|---|
| Styrene-maleic acid copolymeric resin | 22 parts |
| Polyester monooligoacrylate having a terminal - OH group (Allonix M5700 commercially available from Toagosei Chemical Industry Co., Ltd.) | 9 parts |
| Second group: | |
| Epoxy acrylate (Lipoxy VR80 commercially available from Showa Koubunshi Kogyo Kabushiki Kaisha) | 7 parts |
| Benzyl | 1.6 parts |
| Dimethyl amino benzaldehyde | 0.4 parts |
| Third group: | |
| Carbon black | 3.5 parts |
| Phthalocyanine Blue | 0.5 parts |
| Ethylene glycol monoethyl ether | 36 parts |
| Ethanol | 20 parts |

A radiation-sensitive resin composition is prepared in accordance with the procedure similar to that as described in Example 1-2.

Example 1-4

| First group: | |
|---|---|
| Styrene-maleic acid copolymeric resin | 22 parts |
| 2-hydroxy ethyl acrylate | 9 parts |
| Second group: | |
| Polyester monooligoacrylate having a terminal - COOH group (Allonix M 8060 commercially available from Toagosei Chemical Industry Co., Ltd.) | 7 parts |
| Benzyl | 1.6 parts |
| Dimethyl amino benzaldehyde | 0.4 parts |
| Third group: | |
| Carbon black | 3.5 parts |
| Phthalocyanine Blue | 0.5 parts |
| Ethylene glycol monoethyl ether | 36 parts |
| Ethanol | 20 parts |

A radiation-sensitive resin composition is prepared in accordance with the procedure similar to that as described in Example 1-2.

Example 1-5

| First group: | |
|---|---|
| Styrene-maleic acid copolymeric resin | 22 parts |
| Polyester monooligoacrylate having a terminal - OH group | 16 parts |
| Second group: | |
| Benzyl | 1.6 parts |
| Dimethyl amino benzaldehyde | 0.4 parts |
| Third group: | |
| Carbon black | 2.5 parts |
| Phthalocyanine Blue | 0.5 parts |
| Ethylene glycol monoethyl ether | 36 parts |
| Ethanol | 20 parts |

A radiation-sensitive resin composition is prepared in accordance with the procedure similar to that as described in Example 1-2.

Example 1-6

| First group: | |
|---|---|
| Styrene-maleic acid copolymeric resin | 22 parts |
| Ethylene glycol monoethyl ether | 20 parts |
| Second group: | |
| Carbon black | 3.5 parts |
| Phthalocyanine Blue | 0.5 parts |
| Third group: | |
| Polyurethane acrylate (Ubitan 788 commercially available from Thiokol Chemical Corp.) | 16 parts |
| Benzyl | 1.6 parts |
| Dimethyl amino benzaldehyde | 0.4 parts |
| Ethanol | 36 parts |

A radiation-sensitive resin composition is prepared in accordance with the procedure similar to that described in Example 1-1.

Example 1-7

| First group: | |
|---|---|
| Styrene-maleic acid copolymeric resin | 22 parts |
| Ethylene glycol monethyl ether | 10 parts |
| Second group: | |
| Benzyl | 1.6 parts |
| Dimethyl amino benzaldehyde | 0.4 parts |
| Third group: | |
| Carbon black | 3.5 parts |
| Phthalocyanine Blue | 0.5 parts |
| Ethylene glycol monoethyl ether | 26 parts |
| Ethanol | 20 parts |
| 2,2-bis (4-acryloxy diethoxy phenyl) | 16 parts |

A radiation-sensitive resin composition is prepared in accordance with the procedure similar to that as described in Example 1-2.

Example 1-8

The procedure as described in Example 1-1 is repeated except that 2 parts of benzoin isopropyl alcohol is used in place of benzyl and dimethyl amino benzaldehyde in Example 1-1.

Example 1-9

The procedure as described in Example 1-3 is repeated except that 2 parts of benzoin isopropyl alcohol is used in place of benzyl and dimethyl amino benzaldehyde in Example 1-3.

Example 1-10

The procedure as described in Example 1-3 is repeated except that 2 parts of benzyl is separately used in place of benzyl and dimethyl amino benzaldehyde in Example 1-3.

The novel photopolymerizable radiation-sensitive resin composition according to the present invention will be generally usable after it is coated on a support. This is because the resulting coating is effective as a stable layer of radiation-sensitive material since its exposed areas are immediately insolubilized after exposure to radiation. Furthermore, it will be understood that the support to be laid under the layer of radiation-sensitive material may be made of vinyl chloride resins, since one or more solvents which cannot dissolve vinyl chloride or vinyl chloride-vinyl acetate copolymeric resins can be optionally selected from the group consisting of alcohols, polyhydric alcohols and derivatives thereof as the solvent for use in the production of the radiation-sensitive resin composition according to the present invention. However, the materials of the support useful in the present invention also include, for example, paper, metals and the other conventional support materials. While the present invention has been described with respect to the application of its radiation-sensitive resin compositions in the production of cards, it should be appreciated that the radiation-sensitive resin compositions of the present application are also applicable to other technical fields in which known radiation-sensitive resin compositions are used.

The sheet material to which sensitivity is induced by the radiation-sensitive resin composition according to the present invention is illustrated in FIG. 1 of the accompanying drawings. FIG. 1 is a cross-sectional view of a support 10 having coated thereon a layer 11 of a soluble radiation-sensitive material. The radiation-sensitive resin composition which forms the layer 11 of the radiation-sensitive material has been already explained in detail. Generally, the layer 11 additionally contains a pigment. A protective coating 12 may be coated over the layer 11 of the radiation-sensitive material, as is the case with conventional photographic films. The protective coating 12 should be soluble in water or soluble in weak alkali, since the coating 12 is desirably removed with solvents for processing the layer 11. In this connection, it is necessary to take care to avoid such undesirable situations that the protective coating 12 will react with the layer 11 of the radiation-sensitive material and will become insoluble during storage.

The materials of the protective coating 12 which satisfy the above-mentioned requirements are, principally, water-soluble resins or alkali-soluble resins.

While it is well-known that the water-soluble resins include, for example, hydroxy ethyl cellulose, polyethylene oxide, carboxymethylcellulose, polyvinyl alcohol and the like, it is particularly preferred that polyvinyl alcohol is used in embodying the present invention. Preferred polyvinyl alcohol is a partially saponified polyvinyl alcohol which has a degree of polymerization of from 1,000 to 1,500 and a degree of saponification of 80% of less. In the preparation of a protective coating-forming composition containing such water-soluble resin, the resulting composition generally contains 5 through 20% by weight, based on the weight of distilled water used as a solvent, of water-soluble resin, and further contains 0.5 through 5% by weight, based on the weight of the resultant solution, of a non-ionic surfactant or saponin. The non-ionic surfactant or saponin serves to prevent repellency between the layer 11 of the radiation-sensitive material and the protective coating 12 and to increase interfacial affinity therebetween, and, in addition to this, to improve the spreadability of the protective coating-forming composition during its application to form the coating 12. In some cases, the protective coating-forming composition may further contain 5 through 10% by weight, based on its weight, of finely divided silicic anhydride as a filler. Furthermore, in order to prevent focusing of the actinic radiation at the time of exposure, a pigment may be incorporated into the protective coating-forming composition. The pigment used herein is in an amount of 10 through 20% by weight, based on the weight of the solid water-soluble resin. Useful pigment is a water-dispersible pigment and is, for example, commercially available from Dainippon Ink & Chemicals, Inc. under the trade name: RIYU-DYE. Furthermore, a defoaming agent such as tributyl phosphate and the like is frequently used during the preparation of the protective coating-forming composition of the above-mentioned type. However, such a defoaming agent is not related to the composition of the protective coating itself.

The alkali-soluble resins have been already explained in connection with the explanation of the radiation-sensitive resin composition. Examples of these resins include novolak type phenol-formaldehyde resins, copolymers of acrylic or methacrylic acid, alkyd resins having a high acid value, styrene-maleic acid copolymeric resins or its partially esterified resins, alkali salts of styrene-maleic acid copolymeric resins and the like. In order to embody the present invention, it is particularly preferred that the partially esterified products or alkali salts of styrene-maleic acid copolymeric resins are used as the alkali soluble resins. The above-mentioned alkali salts are commercially available from Monsanto Chemical Co., U.S.A., under the trade name: Stymer S Resin. Generally, in the preparation of a protective coating-forming composition containing the above alkali-soluble resin, 5 through 20% by weight, based on the weight of the solvent used, such as ethanol, ethylene glycol monoethyl ether acetate and the like, of the alkali-soluble resin is incorporated into the composition. Furthermore, if desired, finely divided silicic anhydride as a filler and a pigment as a focusing inhibitor may be incorporated into the composition, respectively, as is the case with the above-discussed protective coating-forming composition which contains a water-soluble resin.

The preparations of each of the above-mentioned water-soluble protective coating-forming compositions and alkali-soluble protective coating-forming compositions will be further described with reference to their typical examples.

Example 2-1

| | |
|---|---|
| Polyvinyl alcohol | 5 parts |
| Distilled water | 100 parts |
| Non-ionic surfactant | 1 part |
| Finely divided silicic anhydride | 5 parts |
| Water-dispersible red pigment | 0.5 parts |

First, the distilled water and polyvinyl alcohol are added to a vessel equipped with a water bath or a steam heater, and heated to a temperature of 90° C. while stirring. The finely divided silicic anhydride is added during heating, and the same temperature is maintained for a period of about 2 hours. The thus obtained complete solution is then cooled to a temperature of 40° C., and the red pigment and the non-ionic surfactant are added while cooling. A water-soluble protective coating-forming composition can be obtained.

Example 2-2

| Sodium salt of partially esterified styrene-maleic acid copolymeric resin | 10 parts |
| --- | --- |
| Purified water | 20 parts |
| Ethanol | 45 parts |
| Plasticizer | 5 parts |
| Ethylene glycol monoethyl ether acetate | 20 parts |

These substances are mixed, by stirring, in a vessel equipped with a reflux condenser at a temperature of 50° through 70° C. An alkali-soluble protective coating-forming composition can be obtained.

Generally, the radiation-sensitive sheet material in accordance with the present invention, as has been already described, has the structure illustrated in FIG. 1. For the purpose of producing such a radiation-sensitive sheet material, the following procedure can be used, for example. Namely, a surface of the support 10 is coated with a radiation-sensitive resin composition prepared in any one of Examples 1-1 through 1-10. Then, the coated support 10 is placed in a stream of warm air at a temperature of about 40° C. to evaporate the solvent contained in the coating of the radiation-sensitive resin composition. As a result of this, a layer 11 of radiation-sensitive material is formed on the support 10. Subsequently, a protective coating-forming composition such as prepared in either Example 2-1 or 2-2 is coated on the layer 11 of the radiation-sensitive material. Thereafter, the resulting coating is completely dried in a stream of warm air at a temperature of about 40° through 50° C., whereby a radiation-sensitive sheet material having a protective coating 12 as a topcoat is obtained. For example, if it is intended to produce the radiation-sensitive sheet material which is useful in the production of cards, a transparent sheet of a rigid vinyl chloride having a thickness of 0.08 through 0.1 mm should be preferably used, and, in addition to this, the thicknesses of the layer 11 of the radiation-sensitive material and the protective coating 12 should be desirably about 4 microns and about 5 microns, respectively.

In the practical production of the radiation-sensitive sheet material, it is possible to use a web of support, and to continuously coat on the surface thereof a coating composition. The coated web is suitably cut into sheets of a standard size, packaged under light shielding conditions, and supplied to the user. The user can open a package of the sheet at the time of use.

Figure 2:
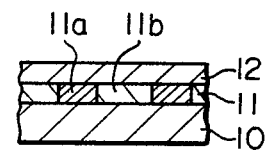
FIG. 2 is a cross-sectional view of the radiation-sensitive sheet material as is shown in FIG. 1, which has been exposed to an actinic radiation.

In FIG. 2, a cross-sectional view of the radiation-sensitive sheet material which has been exposed to actinic radiation through a transparent negative is illustrated. The actinic radiation passes through a transparent negative during exposure, and reaches exposed areas 11a in the layer 11 of the radiation-sensitive material of the shown sheet material. In this case, the protective coating 12 formed on the layer 11 of the radiation-sensitive material does not prevent the transmission of the actinic radiation therethrough. If the support 10 is composed of a transparent material, the actinic radiation may be irradiated from the reverse side of the support 10 through the transparent negative, as is well-known in the art. The exposed areas 11a in the layer 11 of the radiation-sensitive material become insoluble as a result of photoreaction, and adhere to the surface of the underlying support 10. The radiation-sensitive material in the unexposed areas 11b remains unreacted, and therefore its solubility inherent in the radiation-sensitive material is maintained without change. Exposure can be carried out in accordance with the manner well-known in the art. For example, any light source capable of richly emitting ultraviolet radiation of from 2,500 to 4,200 Å, such as a three-phase arc lamp, a super-high pressure mercury vapor lamp, a chemical lamp, a metal halide lamp and the like, can be used as the exposure light source.

Figure 3:
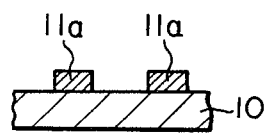
FIG. 3 is a cross-sectional view of the exposed sheet material as is shown in FIG. 2, which has been processed with a processing solution.

FIG. 3 illustrates the condition of the sheet material as shown in FIG. 2, after it has been immersed in a developing solution. After the sheet material is processed with the developing solution, the protective coating 12 existing thereon is completely removed, whereby only the image formed from the radiation-sensitive material in the exposed areas 11a remains. The radiation-sensitive material in the unexposed areas 11b is completely washed off as a result of development and therefore the surface of the underlying support 10 is again exposed. The remaining image coincides with the exposed areas 11a and has a counter which is clearly distinct from the surface, in the unimaged areas, of the support 10. In addition, the image has a vivid colour provided by the pigment. A processing solution used in the development is weakly alkaline. A solution suitable for the above object is, for example, a mixture consisting of 50 parts of anhydrous sodium carbonate, 5 parts of a surfactant and 10,000 parts of water.

The following examples illustrate the results obtained when the radiation-sensitive sheet material according to the present invention is used practically. However, it should be appreciated that the present invention is not limited to these examples.

Example 3-1

Each of the radiation-sensitive resin compositions as described in Examples 1-1 through 1-10 was separately coated on transparent, rigid vinyl chloride sheet having a thickness of 0.1 mm by means of a roll coater so that the thickness of the dried coating was 4 microns. Further, the composition as described in Example 2-1 was coated thereon to form a protective coating having a dry thickness of 5 microns. A radiation-sensitive sheet material was obtained. The resulting sheet material was placed in a vacuum printing frame, being registered with a step wedge having 21 optical photographic densities, and a negative film with transparent dotted images. The layer of the radiation-sensitive material was subjected to an exposure step by means of a 3 kw metal halide lamp, which was located 80 cm away from the radiation-sensitive sheet material, from the reverse side of the sheet material through the step wedge and the negative film, and then processed with the processing solution as described above. The processed sheet material was tested with regard to its sensitivity, developability, dot reproducibility, adherability to vinyl chloride film, and coating strength. The results shown in the following Table II were obtained. Furthermore, when the unprocessed radiation-sensitive sheet material was tested with regard to its shelf stability, the results, also shown in the following Table II, were obtained.

TABLE II

| Composition | Sensitivity | Developability | Dot reproducibility | Adherability | Coating strength | Shelf stability |
|---|---|---|---|---|---|---|
| 1-1 | 120 sec | ◉ | ○ | ◉ | ○ | less than 6 months |
| 1-2 | 90 sec | ○ | ○ | ◉ | ◉ | less than 8 months |
| 1-3 | 20 sec | ◉ | ◉ | ◉ | ◉ | more than 12 months |
| 1-4 | 20 sec | ◉ | ◉ | ◉ | ◉ | more than 12 months |
| 1-5 | more than 400 sec | ◉ | — | — | — | more than 12 months |
| 1-6 | 90 sec | Δ | ○ | Δ | ◉ | more than 12 months |
| 1-7 | 40 sec | Δ | Δ | ○ | ◉ | more than 12 months |
| 1-8 | 360 sec | ◉ | Δ | ◉ | ○ | less than 2 months |
| 1-9 | 180 sec | ◉ | ○ | ◉ | ○ | less than 2 months |
| 1-10 | 240 sec | ◉ | Δ | ◉ | ◉ | less than 6 months |

As to the symbols in Table II

1. Each of the sensitivities described in the table refers to time (seconds) which was necessary to completely cure the sheet material corresponding to the first four steps of the 21 steps in the step wedge.
2. Developability:
◉ A vivid image is formed within 30 seconds, and there is no residue in unexposed areas on the support.
○ A vivid image is formed within 60 seconds, and there is no residue in unexposed areas on the support.
Δ A part of the composition remains on the support, and fogging is caused in spite of development for more than 60 seconds.
3. Dot Reproducibility:
◉ 5% of the dots of the corresponding halftone negative are correctly reproduced.
○ 10% of the dots of the corresponding halftone negative are correctly reproduced.
Δ Reproducible dots are at most 25% of the dots of the corresponding halftone negative.
4. Adherability: (According to peeling test)
○ Adhesion of 100/100
◉ Adhesion of 10/100
Δ Adhesion of 0/100
5. Coating Strength:
○ Coating is not peeled off after rubbing 50 times using a cotton ball moistened with ethanol.
◉ Coating is slightly peeled off after rubbing 50 times using a cotton ball moistened with ethanol.
Δ Coating is completely peeled off after rubbing 50 times using a cotton ball moistened with ethanol.
6. Shelf Stability:
Storageable duration at room temperature.

Example 3-2

The procedure similar to that as described in Example 3-1 was repeated except that the composition as described in Example 2-2 was used in place of the composition of Example 2-1 used in Example 3-1. Results similar to those described in the above Table II were obtained.

I claim:

1. A photopolymerizable radiation-sensitive resin composition comprising a styrene-maleic acid copolymeric resin, and,
   a combination of an ethylenically unsaturated compound which is a mixture of the following compounds (A) and (B):
   (A) one or more ethylenic compounds having a molecular weight of 150 or more, a boiling point, under normal pressure, of 100° C. or more, at least one acryloyl or methacryloyl group, and a terminal hydroxyl group; and
   (B) one or more ethylenic compounds having a molecular weight of 150 or more, a boiling point, under normal pressure, of 100° C. or more, and at least one acryloyl or methacryloyl group and no terminal hydroxyl group;
   and a photopolymerization initiator which comprises benzyl and dimethyl amino benzaldehyde.

2. A composition as defined in claim 1 wherein said styrene-maleic acid copolymeric resin has a molecular weight of 1,000 through 2,000 and an acid value of 130 through 220.

3. A composition as defined in claim 2 wherein said styrene-maleic acid copolymeric resin is a partially esterified styrene-maleic anhydride resin which contains the remaining carboxyl group in its molecule.

4. A composition as defined in claim 1 wherein said ethylenically unsaturated compound is a mixture of one or more ethylenic compounds with at least one acryloyl or methacryloyl group and a terminal hydroxyl group selected from the group consisting of polyester monoacrylate, 2-hydroxyethyl acrylate and 1,4-butylene glycol monoacrylate, and one or more ethylenic compounds with at least one acryloyl or methacryloyl group selected from the group consisting of polyethylene glycol diacrylate, 1,3-butylene glycol diacrylate, 1,4-butylene glycol diacrylate, 1,6-hexane glycol diacrylate, neopentyl glycol diacrylate, 2,2-bis(4-acryloxy diethoxy phenyl) propane, 2,2-bis(4-acryloxy propyloxy phenyl) propane, trimethylol propane triacrylate, tetramethylol methane triacrylate, ethylene glycol dimethacrylate, polyethylene glycol dimethacrylate, 1,6-hexane glycol dimethacrylate, polypropylene glycol dimethacrylate, 2,2-bis(4-methacryloxy ethoxy phenyl) propane, 2,2-bis(4-methacryloxy diethoxy phenyl) propane, trimethylol propane trimethacrylate, polyester acrylate oligomer, polyamide acrylate, epoxy acrylate, polyurethane acrylate and polyester monoacrylate.

5. A composition as defined in claim 1, which further comprises a pigment.

6. A composition as defined in claim 1, which comprises said styrene-maleic acid copolymeric resin as well as 10 through 60% by weight, based on the weight of said copolymeric resin, of said ethylenically unsaturated compound and 1 through 10% by weight, based on the total weight of said copolymeric resin and said ethylenically unsaturated compound, of said photopolymerization initiator.

7. A composition as defined in claim 6 wherein a ratio, of percentage by weight, of said ethylenic compound with at least one acryloyl or methacryloyl group having a terminal hydroxyl group to that having no terminal hydroxyl group is 40 through 60%.

8. A composition as defined in claim 6, which further comprises 1 through 50 parts by weight, based on 100 parts by weight of the composition, of said pigment.

9. A radiation-sensitive sheet material comprising a support and a layer of a radiation-sensitive material coated on at least one side of the support, said layer of the radiation-sensitive material being a layer of a photopolymerizable radiation-sensitive resin composition which comprises a styrene-maleic acid copolymeric resin, and,
   a combination of an ethylenically unsaturated compound which is a mixture of the following compounds (A) and (B):
   (A) one or more ethylenic compounds having a molecular weight of 150 or move, a boiling point, under normal pressure, of 100° C. or more, at least one acryloyl or methacryloyl group, and a terminal hydroxyl group; and;

(B) one or more ethylenic compounds having a molecular weight of 150 or more, a boiling point, under normal pressure, of 100° C. or more, and at least one acryloyl or methacryloyl group and no terminal hydroxyl group;

and a photopolymerization initiator which comprises benzyl and dimethyl amino benzaldehyde.

10. A sheet material as defined in claim 9 wherein said photopolymerizable radiation-sensitive resin composition further comprises a pigment.

11. A sheet material as defined in claim 9 wherein a protective coating is further coated over said layer of the radiation-sensitive material.

12. A sheet material as defined in claim 11 wherein said protective coating comprises a water-soluble resin.

13. A sheet material as defined in claim 12 wherein said water-soluble resin comprises polyvinyl alcohol.

14. A sheet material as defined in claim 13 wherein said polyvinyl alcohol is a partially saponified product of polyvinyl alcohol and has a degree of polymerization of 1,000 through 1,500 and a degree of saponification of 80% or less.

15. A sheet material as defined in claim 11 wherein said protective coating comprises an alkali-soluble resin.

* * * * *